(12) United States Patent
Wong et al.

(10) Patent No.: US 7,570,058 B1
(45) Date of Patent: Aug. 4, 2009

(54) SYSTEM AND METHOD FOR TREATMENT OF LIQUID COOLANT IN AN MRI SYSTEM

(75) Inventors: Julie A. Wong, Milwaukee, WI (US); Garron K. Morris, Whitefish Bay, WI (US); Akira Imai, Hino (JP)

(73) Assignee: General Electric Company, Schnectady, NY (US)

( * ) Notice: Subject to any disclaimer, the term of this patent is extended or adjusted under 35 U.S.C. 154(b) by 0 days.

(21) Appl. No.: 12/171,850

(22) Filed: Jul. 11, 2008

(51) Int. Cl.
*G01V 3/00* (2006.01)
(52) U.S. Cl. .................................. 324/318; 324/322
(58) Field of Classification Search ................. 324/318, 324/322
See application file for complete search history.

(56) References Cited

U.S. PATENT DOCUMENTS

| | | | |
|---|---|---|---|
| 6,867,592 B2* | 3/2005 | Gebhardt et al. ............ 324/318 |
| 7,015,692 B2* | 3/2006 | Clarke et al. ................ 324/300 |
| 7,250,766 B2* | 7/2007 | Morita et al. ............... 324/318 |
| 7,301,343 B1* | 11/2007 | Sellers ........................ 324/318 |
| 7,489,132 B2* | 2/2009 | Arik et al. ................... 324/318 |
| 7,495,444 B2* | 2/2009 | Schuster et al. ............. 324/318 |
| 2007/0137674 A1* | 6/2007 | Shih et al. ................... 134/22.1 |
| 2008/0053918 A1* | 3/2008 | Murphy ....................... 210/743 |

* cited by examiner

*Primary Examiner*—Louis M Arana
(74) *Attorney, Agent, or Firm*—Ziolkowski Patent Solutions Group, SC

(57) ABSTRACT

A system and method for the monitoring and treating of a coolant in a cooling system of an MRI system includes a deionization kit connectable to the cooling system of the MRI system. The deionization kit receives coolant from the cooling system to deionize the coolant and forms a closed-loop system with the cooling system when connected thereto. The deionization kit thus allows for unimpeded circulation of the coolant through the deionization kit and the cooling system. Accordingly, the MRI system may remain in operation and be used to perform MR image acquisitions of an object while the deionization kit is connected to the cooling system.

17 Claims, 4 Drawing Sheets

SYSTEM AND METHOD FOR TREATMENT OF LIQUID COOLANT IN AN MRI SYSTEM

BACKGROUND OF THE INVENTION

Embodiments of the invention relate generally to magnetic resonance imaging (MRI) systems and, more particularly, to the monitoring and treating of a coolant in a cooling system of a magnetic resonance imaging (MRI) system.

When a substance such as human tissue is subjected to a uniform magnetic field (polarizing field $B_1$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Thermal management of the gradient subsystem, as well as other elements in an MRI system, becomes more challenging with demands for increased power, speed and duty cycle. For example, with increased power, speed, and duty cycle in the MRI system comes an increase in the amount of current and voltage supplied by the gradient drivers to the gradient coil. This increase in voltage and current results in increased heat in the system. Thus, many MRI systems employ a cooling system (i.e., heat exchanger) that cools heat-generating components in the gradient sub-system by pumping a coolant through hollow copper tubing attached to or positioned near the heat generating components in the gradient driver and the gradient coils. Cooling tubes may also be attached to other components in the resonance assembly of the MRI system in proximity to the gradient driver and gradient coils. Typically, water is used as the coolant because of its high specific heat capacity and a high thermal conductivity.

In addition to generating increased amounts of heat, the increased voltage and current applied to the gradient drivers also results in a transfer of a leakage current from the electrical components to the coolant. The leakage current is accounted for by maintaining a minimum coolant electrical resistivity to prevent a stray current in the MRI system. To control the electrical resistivity of the coolant, deionized water can be used as the coolant, as deionized water has an extremely high electrical resistivity. However, there are several drawbacks and limitations to the use of deionized water as a coolant. First, deionized water is corrosive to the copper tubing of the cooling system, which can shorten the life span of the cooling system and affect the performance of the MRI system. Second, the electrical resistivity of the deionized water lowers over time, becoming ionized after extensive usage of the MRI system. Thus, a desired minimum coolant electrical resistivity may not be achievable after prolonged usage of the MRI system.

It would therefore be desirable to have a system and method capable of maintaining a desired minimum electrical resistivity in the coolant circulated through a cooling system of an MRI system. It would further be desirable to have a system and method capable of providing a coolant having a minimal corrosive effect on the components of the cooling system.

BRIEF DESCRIPTION OF THE INVENTION

In accordance with one aspect of the invention, a magnetic resonance imaging (MRI) apparatus includes a cooling system thermally coupled to a component of a MRI system, the cooling system comprising a cooling circuit and configured to circulate a coolant through the cooling circuit and extract heat from the coolant. The MRI apparatus also includes a deionization kit connected to the cooling system to receive coolant from the cooling system and to deionize the coolant, wherein the deionization kit forms a closed-loop system with the cooling system to allow unimpeded circulation of the coolant through the deionization kit and the cooling system and to allow operation of the MRI system.

In accordance with another aspect of the invention, a method for servicing a magnetic resonance imaging (MRI) system coolant includes measuring an electrical resistivity of a coolant in circulation through a cooling system in an MRI system, the cooling system configured to cool a component in the MRI system. If the sensed electrical resistivity of the coolant is below a pre-determined threshold, the method also includes attaching a deionization kit to the cooling system and activating the deionization kit to draw coolant from the cooling system and circulate the coolant through the deionization kit. The method further includes measuring an electrical resistivity of the coolant after circulation through the deionization kit and, if the electrical resistivity of the coolant is above the pre-determined threshold, then terminating circulation of the coolant through the deionization kit.

In accordance with yet another aspect of the invention, a deionization kit for deionizing coolant in a magnetic resonance imaging (MRI) machine includes a pump configured to draw coolant from an MRI cooling system, a deionization cartridge coupled to the pump and configured to remove anions and cations from the coolant, and a particulate filter coupled to the deionization cartridge and positioned downstream from the deionization cartridge to remove particulate matter from the coolant.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Embodiments of the invention provide a system and method for monitoring and treating of coolant in an MRI system. In this regard, a deionization kit is provided that allows for the maintaining of a desired minimum electrical resistivity in the coolant. The deionization kit is connectable to a cooling system in a magnetic resonance imaging (MRI) system to receive coolant therefrom and to deionize the coolant. For example, in an embodiment, the deionization kit is connected to a cooling system thermally coupled to the gradient coil assembly to receive coolant therefrom and to deionize the coolant. The deionization kit forms a closed-loop system with the cooling system when connected thereto to allow unimpeded circulation of the coolant through the deionization kit and the cooling system. Accordingly, the MRI system may remain in operation and be used to perform an MR image acquisition of an object while the deionization kit is connected to the cooling system.

Figure 1:
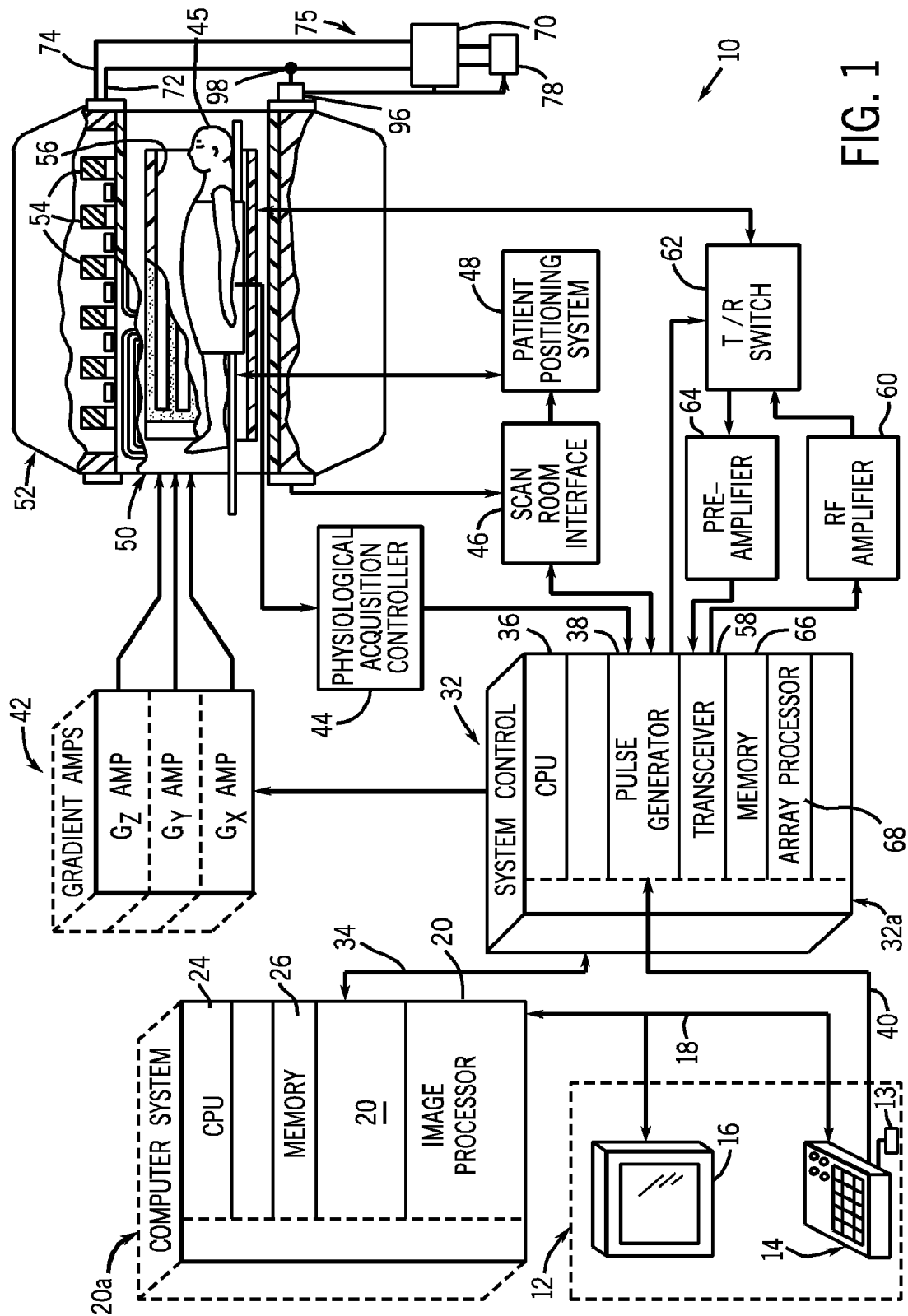
FIG. 1 is a schematic block diagram of an MRI system incorporating an embodiment of the invention.

Referring to FIG. 1, the major components of an exemplary magnetic resonance imaging (MRI) system 10 incorporating embodiments of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient 45, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Gradient coil assembly 50 serves to control magnetic fields over the desired field of view and is excited by gradient amplifiers 42 to produce magnetic gradient fields. When generating the magnetic gradient fields, gradient coil assembly 50 produces heat which should be dissipated to avoid overheating of the MRI system. As such, a cooling system 75 is attached to resonance assembly 52, for example, to the gradient coil assembly 50. The cooling system 75 includes a series of cooling sub-circuits (e.g., cooling tubes) that are distributed, for example, throughout gradient coil assembly 50. The cooling sub-circuits may be positioned at various locations in the resonance assembly 52 as shown in FIG. 2.

Figure 2:
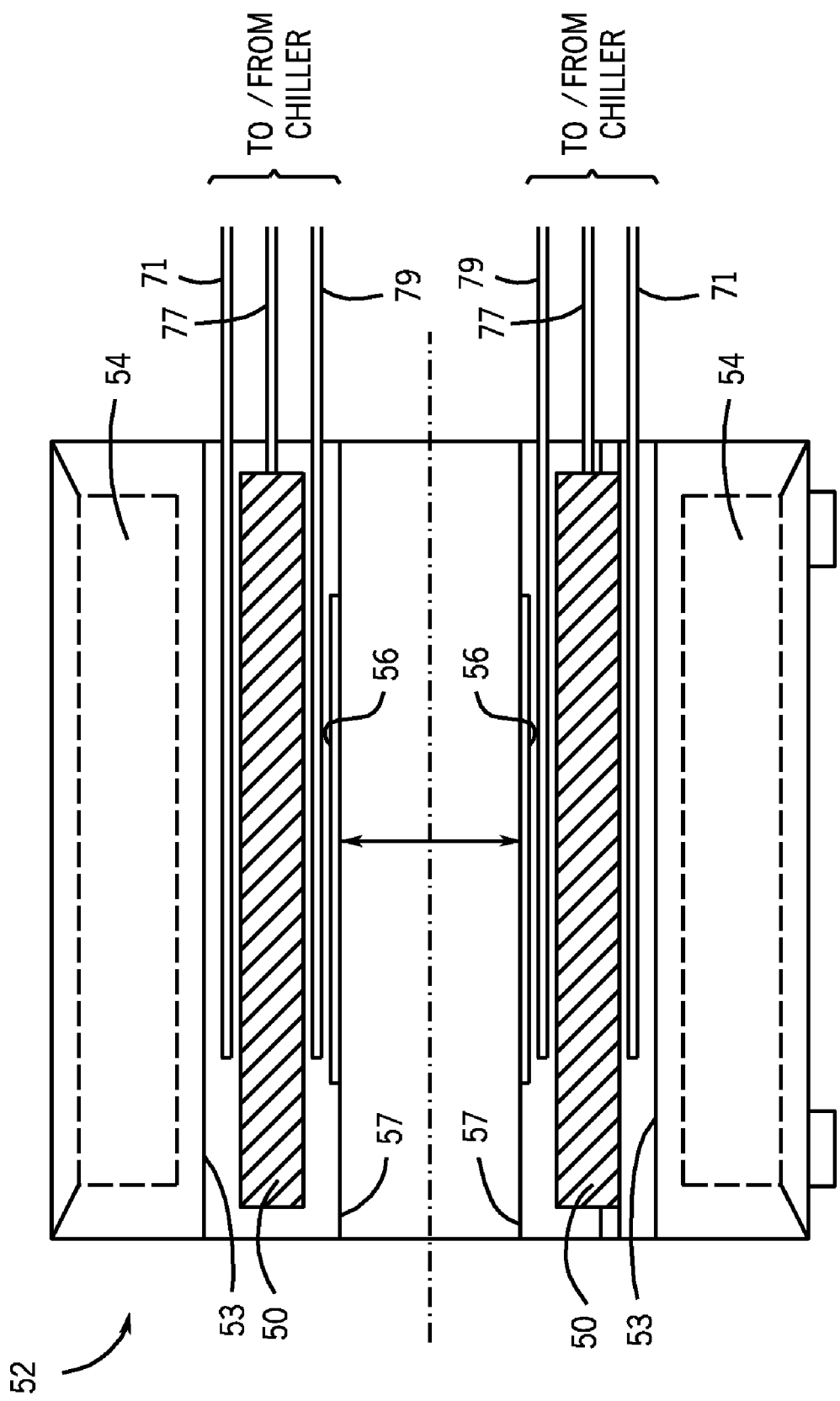
FIG. 2 is a schematic cross-sectional side elevation view of an exemplary resonance assembly in accordance with an embodiment of the invention.

FIG. 2 is a schematic cross-sectional side elevation view of an exemplary resonance assembly 52 in accordance with an embodiment. Resonance assembly 52 is cylindrical and annular in shape. As mentioned, resonance assembly 52 includes, among other elements, a superconducting magnet 54, a gradient coil assembly 50 and an RF coil 56. Various other elements, such as magnet coils, cryostat elements, supports, suspension members, end caps, brackets, etc. are omitted from FIG. 2 for clarity. RF coil 56 is mounted on an outer surface of a patient bore tube 57 and mounted inside and circumferentially surrounded by the gradient coil assembly 50. The gradient coil assembly 50 is mounted inside magnet 54 and is circumferentially surrounded by magnet 54. FIG. 2 illustrates various exemplary placements of cooling tubes (i.e., cooling sub-circuits for the cooling system 75 (shown in FIG. 1). In one example, cooling tubes 71 may be positioned on an outer diameter of the gradient coil assembly 50, mounted between the gradient coil assembly and magnet 54 or mounted on a warm bore surface 53 of the magnet 54. In another example, cooling tubes 77 may be located within the gradient coil assembly 50, for example, one or more of the gradient coils (e.g., the Z or X gradient coil) may be composed of a hollow conductor. When a shielded gradient coil assembly is used, cooling tubes may be positioned between or on inner and outer diameters of the main gradient coil assembly and the shielding gradient coil assembly. In yet another example, cooling tubes 79 may be positioned on an inner diameter of the gradient coil assembly 50 or mounted between the gradient coil assembly 50 and the RF coil 56. Cooling sub-circuits (e.g., cooling tubes) may also be positioned in the resonance assembly 52 in other manners known in the art. Returning to FIG. 1, it should also be understood that cooling system 75 may be connected to cooling sub-circuits in other positions of the MRI system. For example, cooling system 75 may be a system used to provide cooling to power electronics or other heat conductors in the MRI system.

In FIG. 1, cooling system 75 also includes a chiller 70 attached to the cooling sub-circuits (FIG. 2) via a supply or feed line 72 and a return line 74. During normal operation of gradient coil assembly 50, chiller 70 pumps coolant (e.g., liquid coolant) into supply line 72. The coolant is distributed throughout the cooling sub-circuits, and heat generated by gradient coil assembly 50 is transferred into the coolant. Coolant thereby typically rises in temperature to an extent proportional to a heat capacity of coolant. The coolant is returned to chiller 70 via the return line 74. The coolant is cooled within chiller 70 and returned to the cooling sub-circuits through feed line 72. Accordingly, the coolant is continuously re-circulated from the chiller 70 through the feed line 72 to the cooling sub-circuits and from the cooling sub-circuits through the return line 74 to the chiller 70.

According to an embodiment of the invention, MRI system 10 also includes a controller 96 and sensor 98 for monitoring and measuring an electrical resistivity (i.e., ionization level) of the coolant. When the electrical resistivity of the coolant drops below a certain pre-set or pre-determined level, controller 96 is programmed to generate an alert (e.g., audible or visual alert) or provide an indicator to an operator that the electrical resistivity is below the pre-set level. As shown in the embodiment of FIG. 1, controller 96 is also connected to a deionization kit 78 that is attached to chiller 70. The deionization kit allows for filtering and deionization of the coolant on a periodic basis, as will be set forth in greater detail below.

Figure 3:
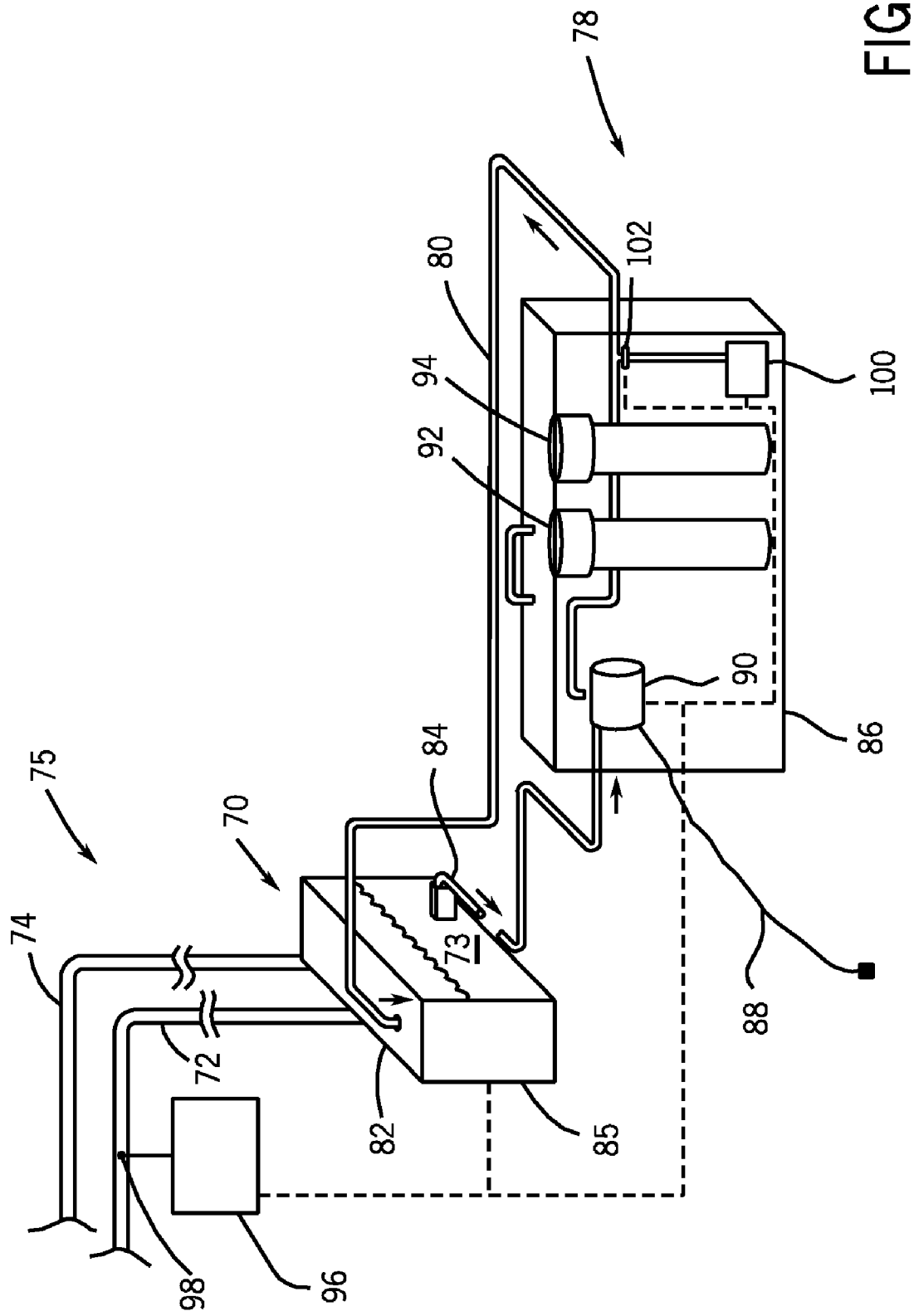
FIG. 3 is a schematic block diagram of a deionization kit connected to an MRI cooling system in accordance with an embodiment of the invention.

Referring now to FIG. 3, deionization kit 78 is shown attached to chiller 70 according to an embodiment of the invention. As shown in FIG. 3, deionization kit is attached to chiller 70 by way of tubing 80 that connects to a refill port 82 and a drain port 84 on chiller 70. The connection of tubing 80 to refill port 82 and drain port 84 is by way of a quick-connect (e.g., snap-fit or twist-fit connection) that allows for easy removal of tubing 80 therefrom. Refill port 82 and drain port 84 allow for a coolant 73 to be withdrawn from a reservoir 85 in chiller 70 by deionization kit 78 and for coolant 73 to be returned to chiller 70 after passing through the deionization kit 78.

As shown in the embodiment of FIG. 3, deionization kit 78 is housed within a carrying case 86 to form a portable unit. Thus, when it is determined by controller 96 and sensor 98 that the electrical resistivity of coolant has fallen below a set level and an operator has been made aware of the undesired electrical resistivity of the coolant (such as by an alert), deionization kit 78 can be transported to MRI system 10 and connected therewith to perform service. While shown as comprising a separate portable unit, deionization kit 78 could also be configured as a fixed unit adjacent the MRI system, or integrated into the MRI system.

When it is determined that service is to be performed on coolant 73 to increase the electrical resistivity thereof, deionization kit 78 is attached to chiller 70 by connecting tubing 80 to refill port 82 and drain port 84. Deionization kit 78 is connected to an electrical power source, such as by way of power cord 88, to provide power to a pump 90 included in the deionization kit 78. Pump 90 acts to draw coolant 73 out from the coolant reservoir 85 of chiller 70 by way of drain port 84 and causes the coolant to circulate through deionization kit 78. The coolant 73 is drawn through pump 90 and forced out to flow through a deionization filter cartridge 92 positioned downstream therefrom. In one embodiment, deionization filter cartridge 92 comprises a mixed bed resin that acts as an ion exchange system for ions present in coolant 73. Passing coolant 73 through deionization filter cartridge 92 reduces the amount of anions and cations present in the coolant, which leads to an increased electrical resistivity.

Positioned in series with deionization filter cartridge 92, and downstream therefrom, is a separate particulate filter 94. The particulate filter 94 is configured to remove any particles that may have accumulated in coolant 73 and remove any loose resin that may have escaped from the upstream deionization filter cartridge 92. In one example, particulate filter 94 may comprise a 50 micron filter for passing coolant 73 therethrough. After passing through particulate filter 94, coolant 73 is directed back to the coolant reservoir 85 of chiller 70 and returned thereto in a deionized and filtered state. The coolant 73 can then be immediately re-circulated through cooling sub-circuits in the MRI system 10 (FIGS. 1 and 2) to allow for continued operation of the MRI system during the deionization process of coolant 73. That is, cooling system 75 and deionization kit 78 form a closed-loop system that allows for operation of the MRI system 10 (FIG. 1) while coolant 73 is circulated/filtered through deionization kit 78.

Coolant 73 from chiller 70 can be passed/circulated through deionization kit 78 a number of times, until a pre-set coolant resistivity is achieved. For example, coolant 73 can be re-circulated through deionization kit 78 until an electrical resistivity of the coolant increases to above the pre-set level (e.g., 2.5 kOhm-cm). According to one embodiment of the invention, controller 96 is connected to deionization kit 78 to control the operation thereof. That is, controller 96 and sensor 98 measure the electrical resistivity of coolant 73 after passing through deionization filter cartridge 92 and particulate filter 94 and exiting deionization kit 78. If the electrical resistivity of coolant 73 measured by controller 96 and sensor 98 is determined to be below the pre-set coolant resistivity level (e.g., 2.5 kOhm-cm), controller 96 continues to run pump 90 so as to continue re-circulation of coolant 73 through deionization kit 78. If, however, the electrical resistivity of coolant 73 is determined by controller 96 and sensor 98 to be at or above the pre-set coolant resistivity level, controller 96 shuts down operation of pump 90 to terminate circulation of coolant 73 through deionization kit 78. More specifically, controller 90 actuates a valve (not shown) in drain port 84 to cut off the flow of coolant 73 from chiller 70 to deionization kit 78 and subsequently shuts down operation of pump 90, such that any coolant remaining in tubing 80 is pumped back to chiller 70. Thus, deionization kit 78 is configured to automatically shut off pump 90 at the preset resistivity level, which gives a field engineer the option to retrieve the deionization kit 78 from the MRI system 10 (FIG. 1) at a later date without having to remain present to perform a manual shutdown of the kit.

As further shown in FIG. 3, controller 96 may also act to control addition of an additive to coolant 73. According to one embodiment of the invention, when the electrical resistivity of coolant 73 measured by controller 96 and sensor 98 is at or above the pre-set coolant resistivity level, the controller 96 activates an additive pump 100 included in deionization kit 78. As mentioned above, during the deionization process, the deionization filter cartridge 92 removes additives (e.g., corrosion resistor, biocide, and pH indicator) from coolant 73. However, once the electrical resistivity of the coolant is at or above the pre-set coolant resistivity level, it is desired to re-add these additives to coolant 73. Thus, after it is determined by controller 96 that no further re-circulation of coolant 73 through deionization kit 78 is needed to further increase the electrical resistivity, controller 96 activates additive pump 100 and actuates a valve 102 so as to cause addition of the additives to coolant 73. In one embodiment, after injecting additives into coolant 73, additive pump 100 forces any coolant 73 remaining in tubing 80 back to chiller 70, as pump 90 is deactivated. Alternatively, controller 96 can activate additive pump 100 to inject the additive into coolant 73 at a pre-set time before shutting down operation of pump 90, thus allowing pump 90 to force any coolant 73 remaining in tubing 80 back to chiller 70. The resulting coolant 73 thus is deionized so as to have a desired electrical resistivity and includes a desired amount of additives therein for resisting corrosion and bacterial growth, and for maintaining a desired pH level. Coolant can then be re-circulated through cooling sub-circuits (FIG. 2) of cooling system 75 for cooling of components of the MRI system 10 until a follow-up service of the coolant 73 is determined to be needed, based again on a measured electrical resistivity of the coolant. While shown in FIG. 3 as being included in deionization kit 78, it is recognized that additive pump 100 could also form part of the cooling system and, for example, be included on chiller 70. In such an embodiment, controller 96 could activate additive pump 100 to add an additive directly to coolant 73 in reservoir 85 upon determining that the electrical resistivity of coolant 73 is at or above the pre-set resistivity level.

Figure 4:
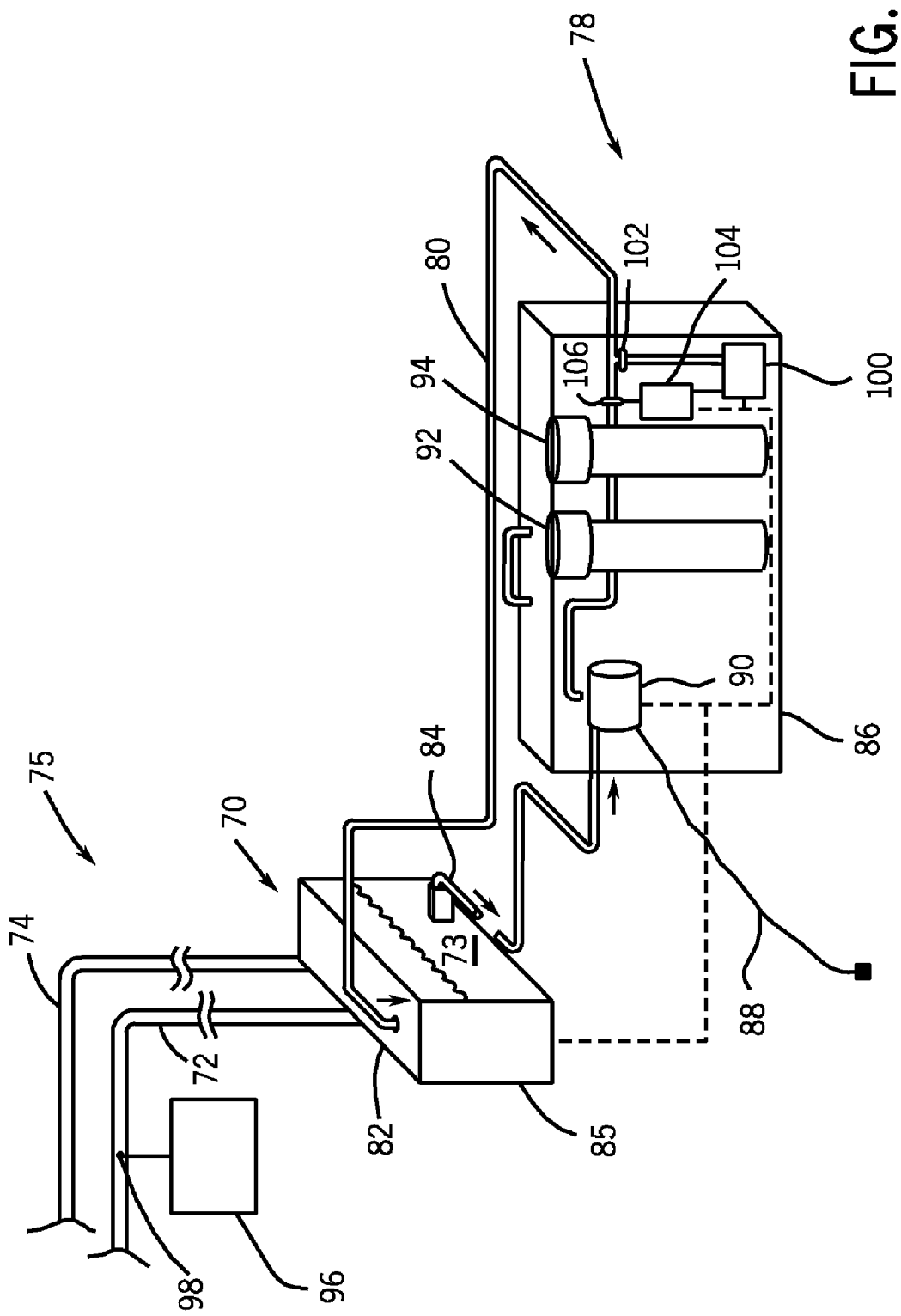
FIG. 4 is a schematic block diagram of a deionization kit connected to an MRI cooling system in accordance with another embodiment of the invention.

Referring now to FIG. 4, according to another embodiment of the invention, deionization kit 78 includes a controller 104 and sensor 106 for determining the electrical resistivity of coolant 73. When it is determined by controller 96 and sensor 98 in MRI system 10 (FIG. 1) that the electrical resistivity of coolant 73 has dropped below a certain pre-determined or pre-set level, deionization kit 78 is attached to cooling system 75 (e.g., chiller 70) as set forth above, and is then activated by an operator. Upon activation, controller 104 and sensor 106 in deionization kit 78 then monitor the electrical resistivity of coolant 73 after passing through deionization filter cartridge 92 and particulate filter 94. If the electrical resistivity of coolant 73 measured by sensor 106 is determined by controller 104 and sensor 106 to be below the pre-set coolant resistivity level (e.g., 2.5 kOhm-cm), controller 104 continues to run pump 90 so as to continue re-circulation of coolant 73 through deionization kit 78. If, however, the electrical resistivity of coolant 73 is measured by controller 104 and sensor 106 to be at or above the pre-set coolant resistivity level, controller 104 shuts down operation of pump 90 to terminate circulation of coolant 73 through deionization kit 78. More specifically, controller 104 actuates a valve (not shown) in drain port 84 to cut off the flow of coolant 73 from chiller 70 to deionization kit 78 and subsequently shuts down operation of pump 90, such that any coolant remaining in tubing 80 is pumped back to chiller 70.

As further shown in FIG. 4, controller 104 of deionization kit 78 also acts to control addition of an additive to coolant 73. Controller 104 is thus electrically connected to additive pump 100 to activate the additive pump upon sensing a electrical resistivity level in coolant 73 to be at or above a pre-set level. Thus, after it is determined that no further re-circulation of coolant 73 through deionization kit 78 is needed to further increase the electrical resistivity, controller 104 activates additive pump 100 so as to cause addition of the additives to coolant 73 before returning the coolant to chiller 70. That is, in one embodiment, after injecting additives into coolant 73, additive pump 100 forces any coolant 73 remaining in tubing 80 back to chiller 70. Alternatively, controller 104 can activate additive pump 100 to inject the additive into coolant 73 at a pre-set time before shutting down operation of pump 90, thus allowing pump 90 to force any coolant 73 remaining in tubing 80 back to chiller 70. The resulting coolant 73 thus is deionized so as to have a desired electrical resistivity and includes a desired amount of additives therein for resisting corrosion and bacterial growth, and stabilizing a pH level in the coolant, and can be re-circulated through cooling system 75 of the MRI system 10 (FIG. 1).

According to an embodiment of the invention, coolant 73 is comprised of a mixture of deionized water and additives for inhibiting, for example, copper corrosion, inhibiting bacteria growth, and controlling pH level, so as to provide optimal cooling properties and electrical resistivity properties. Due to the thermal management requirements for the gradient coil assembly 50, water is used as the base coolant due to its high specific heat and thermal conductivity. The water is in the form of deionized water such that the coolant 73 is resistive to electrical current that may be transferred thereto by the gradient coils 50.

To prevent corrosion of the gradient coils 50 that might occur as a result of the deionized water, a copper corrosion inhibitor may be added to the deionized water. In one embodiment, the copper corrosion inhibitor comprises a halogen resistant azole, although other suitable corrosion inhibitors could also be used. The halogen resistant azole prevents the formation of carbonic acid ($H_2CO_3$) in coolant 73 and the creation of free hydrogen ions (H+) that decrease the resistivity of the water. Also added to the deionized water are a biocide to inhibit growth of bacteria and a pH stabilizer, such as an organic amine compound, to maintain a stable pH level in the coolant. The pH stabilizer acts to maintain pH levels of, for example approximately 8.0 to 9.0 to minimize the corrosion rate of the gradient coil material and maintain a desirable electrical resistivity in the coolant. Additionally, it is envisioned that an inert coloring agent (e.g., FD&C Blue #1) can be added to coolant 73 to assist in detecting leaks in the cooling system 75. By including the above described additives in coolant 73, a coolant is provided that inhibits copper corrosion, resists biological growth, and maintains a stable pH level.

Therefore, according to one embodiment of the invention, a magnetic resonance imaging (MRI) apparatus includes a cooling system thermally coupled to a component of a MRI system, the cooling system comprising a cooling circuit and configured to circulate a coolant through the cooling circuit and extract heat from the coolant. The MRI apparatus also includes a deionization kit connected to the cooling system to receive coolant from the cooling system and to deionize the coolant, wherein the deionization kit forms a closed-loop system with the cooling system to allow unimpeded circulation of the coolant through the deionization kit and the cooling system and to allow operation of the MRI system.

According to another embodiment of the invention, a method for servicing a magnetic resonance imaging (MRI) system coolant includes measuring an electrical resistivity of a coolant in circulation through a cooling system in an MRI system, the cooling system configured to cool a component in the MRI system. If the sensed electrical resistivity of the coolant is below a pre-determined threshold, the method also includes attaching a deionization kit to the cooling system and activating the deionization kit to draw coolant from the cooling system and circulate the coolant through the deionization kit. The method further includes measuring an electrical resistivity of the coolant after circulation through the deionization kit and, if the electrical resistivity of the coolant is above the pre-determined threshold, then terminating circulation of the coolant through the deionization kit.

According to yet another embodiment of the invention, a deionization kit for deionizing coolant in a magnetic resonance imaging (MRI) machine includes a pump configured to draw coolant from an MRI cooling system, a deionization cartridge coupled to the pump and configured to remove anions and cations from the coolant, and a particulate filter coupled to the deionization cartridge and positioned downstream from the deionization cartridge to remove particulate matter from the coolant.

The invention has been described in terms of the preferred embodiments, and it is recognized that equivalents, alternatives, and modifications, aside from those expressly stated, are possible and within the scope of the appending claims. The order and sequence of process or method steps may be varied or re-sequenced according to alternative embodiments.

What is claimed is:

1. A magnetic resonance imaging (MRI) apparatus comprising:
   a cooling system thermally coupled to a component of a MRI system, the cooling system comprising a cooling circuit and configured to circulate a coolant through the cooling circuit and extract heat from the coolant;
   a sensor configured to measure an electrical resistivity value of the coolant;
   a controller coupled to the sensor and configured to receive the electrical resistivity value of the coolant; and
   a deionization kit selectively connectable to the cooling system to receive coolant from the cooling system and to deionize the coolant, the deionization kit forming a closed-loop system with the cooling system when connected thereto to allow unimpeded circulation of the coolant through the deionization kit and the cooling system and to allow operation of the MRI system;
   wherein the controller is configured to generate an alert when the electrical resistivity of the coolant drops below a pre-determined level, the alert being indicative of a desired connection of the deionization kit to the cooling system to deionize the coolant.

2. The MRI apparatus of claim 1, wherein the deionization kit comprises:
   a pump configured to draw coolant from the cooling system;
   a deionization cartridge coupled to the pump and configured to remove anions and cations from the coolant; and
   a particulate filter coupled to the deionization cartridge and positioned downstream from the deionization cartridge to remove particulate matter from the coolant.

3. The MRI apparatus of claim 2, wherein the deionization cartridge comprises a mixed bed resin.

4. The MRI apparatus of claim 2, wherein the controller is further configured to:
   activate the pump to circulate coolant through the deionization kit if the electrical resistivity of the coolant is below a pre-determined level; and
   deactivate the pump to terminate circulation of the coolant through the deionization kit if the electrical resistivity of the coolant is above the pre-determined level.

5. The MRI apparatus of claim 1, wherein the deionization kit further comprises a carrying case configured to enclose the deionization kit.

6. The MRI apparatus of claim 1, wherein the component of the MRI system is a gradient coil assembly.

7. The MRI apparatus of claim 1, wherein the coolant is a liquid coolant comprising a corrosion inhibitor additive, a pH shifting additive, and an organic growth preventer additive.

8. A method for servicing a magnetic resonance imaging (MRI) system coolant comprising:
   measuring an electrical resistivity of a coolant in circulation through a cooling system in an MRI system, the cooling system configured to cool a component in the MRI system; and
   if the sensed electrical resistivity of the coolant is below a pre-determined threshold, then:
      generating a service indicator indicative of an undesired electrical resistivity level in the coolant;
      attaching a deionization kit to the cooling system in response to the service indicator;
      activating the deionization kit to draw coolant from the cooling system and circulate the coolant through the deionization kit;
      measuring an electrical resistivity of the coolant after circulation through the deionization kit; and
      if the electrical resistivity of the coolant is above the pre-determined threshold, then terminating circulation of the coolant through the deionization kit.

9. The method of claim 8, wherein activating the deionization kit comprises:
   activating a pump in the deionization kit to draw coolant from the cooling unit;
   directing the coolant from the pump through a deionization cartridge and a particulate filter arranged in series; and
   returning the deionized and filtered coolant to the cooling system.

10. The method of claim 8, wherein the coolant is directed through the cooling system and the deionization kit in a closed-loop pattern.

11. The method of claim 8, further comprising activating the MRI system to acquire MRI data during operation of the deionization kit.

12. The method of claim 8, further comprising adding a plurality of coolant additives to the coolant after sensing that the electrical resistivity of the coolant is above the pre-determined threshold.

13. A deionization kit for deionizing coolant in a magnetic resonance imaging (MRI) machine, the deionization kit comprising:
   tubing having a first end and a second end opposite the first end, the first end selectively connectable to an MRI cooling system and having a quick-connect connector thereon for selective connection to and detachment from the MRI cooling system;
   a pump coupled to the tubing and configured to draw coolant from the MRI cooling system;
   a deionization cartridge coupled to the pump and configured to remove anions and cations from the coolant; and a particulate filter coupled to the deionization cartridge and positioned downstream from the deionization cartridge to remove particulate matter from the coolant.

14. The deionization kit of claim 13, wherein the deionization cartridge comprises a mixed bed resin.

15. The deionization kit of claim 13, further comprising a controller configured to:
   measure an electrical resistivity of the coolant; and
   deactivate the pump to terminate circulation of the coolant through the deionization kit if the electrical resistivity of the coolant is at a pre-determined level.

16. The deionization kit of claim 13, further comprising a carrying case enclosure configured to house the tubing, the pump, the deionization cartridge, and the particulate filter such that the deionization kit is portable.

17. The deionization kit of claim 13, wherein the deionization kit forms a closed-loop system when connected to the MRI cooling system.

* * * * *